(12) United States Patent
McLeod (10) Patent No.: US 7,828,899 B2
(45) Date of Patent: Nov. 9, 2010

(54) IN-LINE, PASS-BY SYSTEM AND METHOD FOR DISC VAPOR LUBRICATION

(75) Inventor: Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/957,600

(22) Filed: Oct. 5, 2004

(65) Prior Publication Data

US 2005/0039687 A1 Feb. 24, 2005

Related U.S. Application Data (62) Division of application No. 10/078,495, filed on Feb. 21, 2002, now Pat. No. 6,808,741.

(60) Provisional application No. 60/348,782, filed on Oct. 26, 2001.

(51) Int. Cl.
C23C 16/00 (2006.01)
C23C 16/448 (2006.01)
C23C 16/455 (2006.01)

(52) U.S. Cl. .............. 118/718; 118/715; 118/723 VE; 118/726

(58) Field of Classification Search ................. 118/718, 118/715, 719, 726, 723 VE; 204/298.15
See application file for complete search history.

(56) References Cited

U.S. PATENT DOCUMENTS

| | | | |
|---|---|---|---|
| 3,617,348 A | * | 11/1971 | Kelley et al. ............. 438/679 |
| 3,945,903 A | * | 3/1976 | Svendor et al. ........ 204/192.26 |
| 4,002,804 A | | 1/1977 | Akashi et al. |
| 4,015,030 A | | 3/1977 | Sasazawa et al. |
| 4,064,292 A | | 12/1977 | Schoenafinger et al. |
| 4,071,610 A | | 1/1978 | Koester et al. |
| 4,096,822 A | * | 6/1978 | Yamawaki et al. .......... 118/729 |
| 4,109,287 A | | 8/1978 | Kawai et al. |

(Continued)

FOREIGN PATENT DOCUMENTS

JP          4-127422          *    4/1992

(Continued)

OTHER PUBLICATIONS

Notice of Allowance Dated Feb. 24, 2006; U.S. Appl. No. 10/663,698.

(Continued)

*Primary Examiner*—Jeffrie R Lund (57) ABSTRACT

An apparatus for performing simultaneous pass-by vapor deposition of a uniform thickness thin film of a lubricant on at least one surface of each of a plurality of substrates. The apparatus includes a (a) chamber member having an interior space adapted to be maintained at a reduced pressure below atmospheric pressure; (b) at least one linearly extending vapor source member for supplying the interior space of the chamber with at least one linearly extending stream of lubricant vapor; (c) a substrate/workpiece mounting/supporting member adapted for supporting thereon a plurality of substrates/workpieces; and (d) a transporter/conveyor member for continuously moving the substrate/workpiece mounting/supporting member transversely past the at least one linearly extending stream of lubricant vapor for depositing a uniform thickness thin film of lubricant on the surfaces of each of a plurality of substrates/workpieces carried by the substrate/workpiece mounting/supporting member.

19 Claims, 2 Drawing Sheets

U.S. PATENT DOCUMENTS

| | | | |
|---|---|---|---|
| 4,167,582 A | 9/1979 | Takahashi et al. | |
| 4,197,347 A | 4/1980 | Ogawa et al. | |
| 4,236,876 A | 12/1980 | Fraser et al. | |
| 4,255,492 A | 3/1981 | Audran et al. | |
| 4,305,993 A | 12/1981 | Zaitsu et al. | |
| 4,391,614 A | 7/1983 | Rozmus | |
| 4,396,361 A | 8/1983 | Fraser, Jr. | |
| 4,396,596 A | 8/1983 | Ogisu et al. | |
| 4,410,311 A | 10/1983 | Hennessy | |
| 4,425,404 A | 1/1984 | Suzuki et al. | |
| 4,437,813 A | 3/1984 | Ingram | |
| 4,475,946 A | 10/1984 | Matsufuji et al. | |
| 4,481,253 A | 11/1984 | Matsufuji et al. | |
| 4,491,619 A | 1/1985 | Biermann et al. | |
| 4,511,594 A | 4/1985 | Yanai et al. | |
| 4,540,449 A | 9/1985 | Yoshida et al. | |
| 4,540,618 A | 9/1985 | Suzuki et al. | |
| 4,548,682 A | 10/1985 | Yoshida et al. | |
| 4,563,397 A | 1/1986 | Ishiguro et al. | |
| 4,579,508 A | 4/1986 | Tsumaki et al. | |
| 4,620,081 A * | 10/1986 | Zeren | 219/121.15 |
| 4,626,941 A | 12/1986 | Sawada et al. | |
| 4,645,703 A | 2/1987 | Suzuki et al. | |
| 4,650,708 A | 3/1987 | Takahashi | |
| 4,681,669 A | 7/1987 | Takahashi et al. | |
| 4,729,924 A | 3/1988 | Skorjanec et al. | |
| 4,738,111 A | 4/1988 | Edwards | |
| 4,741,921 A | 5/1988 | Kitaoka et al. | |
| 4,741,967 A | 5/1988 | Yoshihara et al. | |
| 4,748,017 A | 5/1988 | Matsui et al. | |
| 4,761,082 A | 8/1988 | Gabelli | |
| 4,780,169 A * | 10/1988 | Stark et al. | 156/345.34 |
| 4,857,417 A | 8/1989 | Kitaoka et al. | |
| 4,880,687 A | 11/1989 | Yokoyama et al. | |
| 4,885,189 A | 12/1989 | Yasunaga et al. | |
| 4,894,133 A * | 1/1990 | Hedgcoth | 204/192.15 |
| 4,923,806 A | 5/1990 | Klodowski | |
| 5,019,210 A | 5/1991 | Chou et al. | |
| 5,062,904 A | 11/1991 | Yoden | |
| 5,062,938 A | 11/1991 | Howard | |
| 5,069,967 A | 12/1991 | Yokoyama et al. | |
| 5,080,971 A | 1/1992 | Yokoyama et al. | |
| 5,094,898 A | 3/1992 | Morita et al. | |
| 5,104,685 A | 4/1992 | Takahashi et al. | |
| 5,215,420 A | 6/1993 | Hughes et al. | 414/217 |
| 5,229,899 A | 7/1993 | Brown et al. | 360/97.02 |
| 5,232,503 A | 8/1993 | Lewis | 118/421 |
| 5,250,150 A | 10/1993 | Gaud et al. | |
| 5,297,422 A | 3/1994 | Baret | |
| 5,302,300 A | 4/1994 | Porri | |
| 5,331,487 A | 7/1994 | Gregory et al. | 360/97.02 |
| 5,366,679 A | 11/1994 | Streicher | |
| 5,376,180 A * | 12/1994 | Mahler | 118/728 |
| 5,395,224 A | 3/1995 | Caillat et al. | |
| 5,458,918 A * | 10/1995 | Hawkins et al. | 427/248.1 |
| 5,470,636 A | 11/1995 | Wakui et al. | |
| 5,480,694 A | 1/1996 | Daimon et al. | |
| 5,554,309 A | 9/1996 | Bruce et al. | |
| 5,560,777 A * | 10/1996 | Ahn | 118/723 E |
| 5,618,133 A | 4/1997 | Mitsui et al. | |
| 5,650,131 A | 7/1997 | Lown et al. | |
| 5,677,051 A | 10/1997 | Ueda et al. | |
| 5,679,473 A | 10/1997 | Murayama et al. | |
| 5,709,726 A * | 1/1998 | Terneu et al. | 65/157 |
| 5,731,068 A | 3/1998 | Mizunoya et al. | |
| 5,814,153 A * | 9/1998 | Ishikawa | 118/719 |
| 5,814,196 A * | 9/1998 | Hollars et al. | 204/298.15 |
| 5,846,328 A * | 12/1998 | Aruga et al. | 118/718 |
| 5,856,992 A | 1/1999 | Karube et al. | |
| 5,882,415 A * | 3/1999 | Helling et al. | 118/723 EB |
| 5,914,180 A | 6/1999 | Ito et al. | |
| 5,925,404 A | 7/1999 | Chiba et al. | |
| 5,976,258 A * | 11/1999 | Kleiner | 118/718 |
| 6,006,652 A | 12/1999 | Peng | |
| 6,037,241 A * | 3/2000 | Powell et al. | 438/479 |
| 6,045,931 A | 4/2000 | Song et al. | |
| 6,153,063 A | 11/2000 | Yamada et al. | |
| 6,176,932 B1 * | 1/2001 | Watanabe et al. | 118/719 |
| 6,183,831 B1 * | 2/2001 | Hughes et al. | 428/833.6 |
| 6,187,101 B1 * | 2/2001 | Yoshizawa | 118/718 |
| 6,200,389 B1 * | 3/2001 | Miller et al. | 118/729 |
| 6,203,958 B1 | 3/2001 | Oya et al. | |
| 6,231,732 B1 * | 5/2001 | Hollars et al. | 204/298.26 |
| 6,242,086 B1 | 6/2001 | Song et al. | |
| 6,246,136 B1 | 6/2001 | Ichiyama | |
| 6,264,852 B1 * | 7/2001 | Herchen et al. | 216/60 |
| 6,279,505 B1 * | 8/2001 | Plester et al. | 118/723 VE |
| 6,331,773 B1 | 12/2001 | Engel | |
| 6,468,670 B1 | 10/2002 | Ikeda et al. | |
| 6,497,799 B1 | 12/2002 | McLeod | |
| 6,524,724 B1 | 2/2003 | Cheng et al. | |
| 6,572,934 B2 * | 6/2003 | Watanabe et al. | 427/534 |
| 6,613,151 B1 * | 9/2003 | Stirniman et al. | 118/726 |
| 6,663,716 B2 * | 12/2003 | Loan et al. | 118/726 |
| 6,673,156 B2 * | 1/2004 | Martin | 118/718 |
| 6,708,385 B1 | 3/2004 | Lemelson | |
| 6,753,077 B2 | 6/2004 | Nakata et al. | |
| 6,808,741 B1 * | 10/2004 | McLeod | 427/131 |
| 6,821,618 B2 | 11/2004 | Koujima et al. | |
| 7,081,268 B2 | 7/2006 | Chang et al. | |
| 7,354,618 B2 | 4/2008 | Chang et al. | |
| 7,354,630 B2 | 4/2008 | Ranjan et al. | |
| 2001/0010204 A1 | 8/2001 | Takeyama et al. | |
| 2001/0031383 A1 | 10/2001 | Sakawaki et al. | |
| 2002/0028355 A1 | 3/2002 | Nakamura et al. | |
| 2002/0037439 A1 | 3/2002 | Litvinov et al. | |
| 2002/0043457 A1 * | 4/2002 | Tani et al. | 204/298.14 |
| 2002/0061421 A1 | 5/2002 | Dieny | |
| 2002/0094458 A1 | 7/2002 | Nakata et al. | |
| 2002/0160232 A1 | 10/2002 | Shimizu et al. | |
| 2003/0041801 A1 * | 3/2003 | Hehmann | 118/715 |
| 2003/0053269 A1 | 3/2003 | Nishiyama | |
| 2003/0059648 A1 | 3/2003 | Akimoto et al. | |
| 2003/0064253 A1 | 4/2003 | Uwazumi et al. | |
| 2003/0157375 A1 | 8/2003 | Uwazumi et al. | |
| 2003/0159919 A1 * | 8/2003 | Fairbairn et al. | 204/192.2 |
| 2003/0200927 A1 * | 10/2003 | Watanabe et al. | 118/719 |
| 2004/0112291 A1 * | 6/2004 | Stirniman et al. | 118/719 |
| 2004/0129224 A1 | 7/2004 | Yamazaki | |
| 2004/0247940 A1 | 12/2004 | Chang et al. | |
| 2005/0039687 A1 * | 2/2005 | McLeod | 118/729 |
| 2005/0089903 A1 * | 4/2005 | Caren et al. | 435/6 |
| 2005/0098426 A1 | 5/2005 | Ranjan et al. | |
| 2005/0100664 A1 | 5/2005 | Chang et al. | |
| 2005/0100764 A1 | 5/2005 | Ranjan et al. | |
| 2005/0132960 A1 * | 6/2005 | Tanaka | 118/719 |
| 2006/0048893 A1 | 3/2006 | Selwyn et al. | |
| 2009/0155765 A1 * | 6/2009 | Atwood et al. | 435/3 |

FOREIGN PATENT DOCUMENTS

| | | | |
|---|---|---|---|
| JP | 2000-313952 A | * | 11/2000 |
| WO | WO 02095086 A1 | | 11/2002 |

OTHER PUBLICATIONS

Non-Final Office Action Dated May 18, 2005; U.S. Appl. No. 10/663,698.

Toshiaki Keitoku, et al., Preparation of Co-Cr-Pt Alloy Film With High Perpendicular Coercivity And Large Negative Nucleation Field, Journal of Magnetism and Magnetic Materials 235 (2001) pp. 34-39.

Takashi Hikosaka, et al., Oxygen Effect On The Microstructure And Magnetic Properties of Binary CoPt Thin Films for Perpendicular Recording, IEEE Transactions on Magnetics, vol. 30, No. 6, Nov. (1994), pp. 4026-4028.

R.H. Victora, et al., Superlattice Magnetic Recording Media: Experiment and Simulation, Journal of Magnetism and Magnetic Materials 235 (2001) pp. 301-311.

Masaru Uchida, et al., Preparation of Fe-Pt Perpendicular Double-Layered Media With High Electric Resistivity Backlayer, Journal of Magnetism and Magnetic Materials 235 (2001) pp. 143-147.

Final Office Action Dated Nov. 2, 2005; U.S. Appl. No. 10/663,698.

Notice of Allowance Dated Nov. 16, 2007; U.S. Appl. No. 10/701,418.

Non-Final Office Action Dated May 18, 2006; U.S. Appl. No. 10/701,418.

Final Office Action Dated Oct. 31, 2006; U.S. Appl. No. 10/701,418.

Non-Final Office Action Dated Feb. 21, 2007; U.S. Appl. No. 10/701,418.

Non-Final Office Action Dated May 18, 2007; U.S. Appl. No. 10/701,418.

Notice of Allowance Dated Nov. 16, 2007; U.S. Appl. No. 10/704,593.

Non-Final Office Action Dated Dec. 13, 2005; U.S. Appl. No. 10/704,593.

Non-Final Office Action Dated May 30, 2006; U.S. Appl. No. 10/704,593.

Miscellaneous Office Action Dated Nov. 14, 2006; U.S. Appl. No. 10/704,593.

Final Office Action Dated Mar. 12, 2007; U.S. Appl. No. 10/704,593.

Non-Final Office Action Dated May 18, 2007; U.S. Appl. No. 10/704,593.

Non-Final Office Action Dated Feb. 21, 2008; U.S. Appl. No. 10/739,291.

Final Office Action Dated Dec. 8, 2008; U.S. Appl. No. 10/739,291.

Notice of Allowance Dated May 18, 2004; U.S. Appl. No. 10/078,495.

* cited by examiner

IN-LINE, PASS-BY SYSTEM AND METHOD FOR DISC VAPOR LUBRICATION

CROSS-REFERENCE TO RELATED APPLICATIONS

This application is a divisional of application Ser. No. 10/078,495, filed on Feb. 21, 2002, now U.S. Pat. No. 6,808,741, which claims priority from U.S. provisional patent application Ser. No. 60/348,782, filed Oct. 26, 2001, the entire disclosures of which are incorporated herein by reference.

FIELD OF THE INVENTION

The present invention relates to an apparatus and method for uniformly applying a thin film of a lubricant to opposing surfaces of a plurality of substrates in a solventless manner. The invention has particular utility in the manufacture of magnetic or magneto-optical ("MO") data/information storage and retrieval media comprising a layer stack or laminate of a plurality of layers formed on suitable substrates, e.g., disc-shaped substrates, wherein a thin lubricant topcoat is applied to the upper surface of the layer stack or laminate for improving tribological performance of the media when utilized with read/write transducers operating at very low flying heights.

BACKGROUND OF THE INVENTION

Magnetic and MO media are widely employed in various applications, particularly in the computer industry for data/information storage and retrieval purposes. A magnetic medium in e.g., disc form, such as utilized in computer-related applications, comprises a non-magnetic disc-shaped substrate, e.g., of glass, ceramic, glass-ceramic composite, polymer, metal, or metal alloy, typically an aluminum (Al)-based alloy such as aluminum-magnesium (Al—Mg), having at least one major surface on which a layer stack or laminate comprising a plurality of thin film layers constituting the medium are sequentially deposited. Such layers may include, in sequence from the substrate deposition surface, a plating layer, e.g., of amorphous nickel-phosphorus (Ni—P), a polycrystalline underlayer, typically of chromium (Cr) or a Cr-based alloy such as chromium-vanadium (Cr—V), a magnetic layer, e.g., of a cobalt (Co)-based alloy, and a protective overcoat layer, typically of a carbon (C)-based material having good tribological properties. A similar situation exists with MO media, wherein a layer stack or laminate is formed on a substrate deposition surface, which layer stack or laminate comprises a reflective layer, typically of a metal or metal alloy, one or more rare-earth thermo-magnetic (RE-TM) alloy layers, one or more transparent dielectric layers, and a protective overcoat layer, for functioning as reflective, transparent, writing, writing assist, and read-out layers, etc.

Thin film magnetic and MO media in disc form, such as described supra, are typically lubricated with a thin film of a polymeric lubricant, e.g., a perfluoropolyether, to reduce wear of the disc when utilized with data/information recording and read-out heads/transducers operating at low flying heights, as in a hard disc system functioning in a contact start-stop ("CSS") mode. Conventionally, a thin film of lubricant is applied to the disc surface(s) during manufacture by dipping into a bath containing a small amount of lubricant, e.g., less than about 1% by weight of a fluorine-containing polymer, dissolved in a suitable solvent, typically a perfluorocarbon, fluorohydrocarbon, or hydrofluoroether. However, a drawback inherent in such dipping process is the consumption of large quantities of solvent, resulting in increased manufacturing cost and concern with environmental hazards associated with the presence of toxic or otherwise potentially harmful solvent vapors in the workplace.

Another drawback associated with the conventional dipping method for applying a thin film of a polymeric lubricant to a substrate results from the lubricant materials being mixtures of long chain polymers, with a distribution of molecular weights. Since the molecular weight of the polymeric lubricant affects the mechanical (i.e., tribological) performance of the head-disc interface, it is common practice to subject the polymeric lubricant mixtures (as supplied by the manufacturer) to a fractionation process prior to adding the lubricant to the solvent in order to obtain a fraction having a desired molecular weight distribution providing optimal tribological performance. However, such pre-fractionation undesirably adds an additional step and increases the overall process cost.

Vapor deposition of thin film lubricants is an attractive alternative to dip lubrication in view of the above drawbacks. Specifically, vapor deposition of lubricant films is advantageous in that it is a solventless process and the process for generating the lubricant vapor can simultaneously serve for fractionating the lubricant mixture into a desired molecular weight distribution, thereby eliminating the need for a pre-fractionation step. Moreover, vapor deposition techniques can provide up to about 100% bonded lubricant molecules when utilized with appropriate polymeric lubricants and magnetic and/or MO disc substrates having deposition surfaces comprised of a freshly-deposited carbon-based protective overcoat layer which is not exposed to air prior to lubricant deposition thereon.

However, existing vapor deposition apparatus (e.g., the Intevac VLS 100 system, Intevac Corp., Santa Clara, Calif., described in detail in U.S. Pat. No. 6,183,831 B1, the disclosure of which is incorporated herein by reference) for applying a thin layer of polymeric lubricant to a thin film data/information storage and retrieval medium, e.g., in disc form, utilize a static process/system, wherein a single disc-shaped substrate is moved (e.g., by means of a disc lifter) to a position facing the orifices of a pair of oppositely facing lubricant vapor sources and statically maintained at that position while the lubricant film is deposited on the disc surfaces, with the lubricant film thickness being determined (i.e., controlled) by the length of the interval during which the disc surfaces are statically maintained facing the orifices of the lubricant vapor sources.

In order to control the spatial distribution, hence thickness uniformity, of the lubricant thin films obtained with such static vapor deposition process/apparatus at deposition rates of from about 1 to about 10 Å/sec. for providing lubricant film thicknesses up to about 50 Å, a diffuser plate for the lubricant vapor is provided intermediate the lubricant vapor source and the substrate surface, thereby adding to the system complexity and necessitating periodic maintenance of the diffuser plate for ensuring clear vapor passage through each of the openings in the diffuser plate. In addition, such static vapor lubrication systems incur a drawback when utilized as part of an in-line or similar type multi-chamber or modular system for manufacturing magnetic or MO media, in that a line-of-sight path is required for the mechanism utilized for positioning the disc surface opposite the lubricant vapor source. As a result, a path can be established for the lubricant vapor to escape from the lubricant deposition chamber into adjacent process chambers utilized for different processing functions and result in their being contaminated with lubricant vapor.

In addition to the above drawbacks, lubricant vapor deposition of disc substrates utilizing apparatus such as described in the aforementioned U.S. Pat. No. 6,183,831 B1 incurs several additional drawbacks and disadvantages, as follows:

while the process for generating the lubricant vapor can simultaneously serve for fractionating the lubricant mixture into a desired molecular weight distribution, thereby eliminating the need for a pre-fractionation step, when the finite amount of polymeric lubricant mixture initially contained in the vapor source is evaporated, the lighter, lower molecular weight ("MW") molecules tend to evaporate first, leading to variation of the average MW of the deposited lubricant over time, which variation in turn results in a variation of the properties of the resultant lubricant films over time;

the single disc vapor deposition apparatus of U.S. Pat. No. 6,183,831 B1 typically forms part (i.e., a module) of a continuously operable, in-line apparatus for automated manufacture of magnetic or MO disc media, e.g., an Intevac MDP 250B Magnetic Disc Coater (as described in U.S. Pat. No. 5,215,420, the disclosure of which is incorporated herein by reference). However, combination of the single disc vapor deposition apparatus with the continuously operable, in-line apparatus for automated manufacture results in a significant reduction in product throughput, in that the latter apparatus is capable of processing approximately six times the number of discs that can be processed in a given period of time by the single disc vapor deposition apparatus of U.S. Pat. No. 6,183,831 B1;

the stream of lubricant vapor formed by the vapor sources in the apparatus of U.S. Pat. No. 6,183,831 B1 is circularly-shaped, and thus unable to provide a uniform thickness lubricant layer on a plurality of discs transported past the source on a conveyor means such as a pallet;

the lubricant vapor sources in the apparatus of U.S. Pat. No. 6,183,831 B1 lack provision for maintaining a constant distribution of lubricant MWs, inasmuch as the lubricant is evaporated from a reservoir within the respective sources which can only be manually replenished (i.e., filled), necessitating interrupting operation of the apparatus and opening of the chamber of the vapor lubricant module;

when, as indicated supra, the vapor deposition apparatus of U.S. Pat. No. 6,183,831 B1 forms part (i.e., a module) of a continuously operable, in-line apparatus for automated manufacture of magnetic or MO disc media (e.g., an Intevac MDP 250B Magnetic Disc Coater), operation of the vapor deposition module or portion of the system entails removing discs from a cassette which holds up to 25 freshly carbon-coated discs unexposed to air, and vapor lubricant coating the discs one-at-a-time. Because the first disc removed from the cassette for vapor lubrication is always colder than the last, due to its shorter residence time in the vapor lubrication main chamber prior to being subjected to lubricant vapor deposition thereon, the resultant lubricant coating on the first disc is thicker than that formed on the last disc. Further, since discs at the ends of the cassette radiate heat to different surfaces than interiorly-located discs, they also attain different temperatures prior to lubricant deposition thereon and therefore exhibit corresponding variations in lubricant coating thickness; and the apparatus of U.S. Pat. No. 6,183,831 B1 does not provide for removal of lubricant from the cassettes prior to their re-insertion into the apparatus for re-use.

In view of the above, there exists a clear need for improved means and methodology for depositing thin films of a lubricant, e.g., a polymeric lubricant, by vapor techniques and at deposition rates consistent with the throughput requirements of automated manufacturing processing, e.g., of magnetic and/or MO data/information storage and retrieval media, which means and methodology overcome the above-described drawbacks and disadvantages of the conventional static lubricant vapor deposition technology. More specifically, there exists a need for improved means and methodology for vapor depositing thin films of lubricant (e.g., a polymeric lubricant) which provides improved lubricant film thickness uniformity over the entire deposition area of disc-shaped substrates utilized in the manufacture of such magnetic and/or MO media.

The present invention addresses and solves problems and difficulties in achieving uniform thickness lubricant thin film deposition over a plurality of disc-shaped substrates by means of vapor deposition techniques, e.g., thin film polymeric lubricant deposition on disc substrates utilized in the manufacture of magnetic and/or MO media, while maintaining full capability with all aspects of conventional automated manufacturing technology therefor. Further, the means and methodology afforded by the present invention enjoy diverse utility in the manufacture of various other devices and articles requiring deposition of uniform thickness thin film lubricant layers thereon.

DISCLOSURE OF THE INVENTION

An advantage of the present invention is an improved pass-by method for simultaneously vapor depositing a uniform thickness thin film of a lubricant on at least one surface of each of a plurality of substrates.

Another advantage of the present invention is an improved pass-by method for simultaneously vapor depositing a uniform thickness thin film of a lubricant on at least one surface of each of a plurality of substrates as part of an in-line process for the manufacture of disc-shaped magnetic and/or magneto-optical recording media.

Yet another advantage of the present invention is an improved apparatus for performing simultaneous pass-by vapor deposition of a uniform thickness thin film of a lubricant on at least one surface of each of a plurality of substrates.

Still another advantage of the present invention is an improved apparatus for performing simultaneous pass-by vapor deposition of a uniform thickness thin film of a lubricant on at least one surface of each of a plurality of substrates as part of an in-line process/apparatus utilized for the manufacture of disc-shaped magnetic and/or magneto-optical (MO) recording media.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a pass-by method for simultaneously vapor depositing a uniform thickness thin film of a lubricant on at least one surface of each of a plurality of substrates, comprising steps of:

(a) providing an in-line apparatus comprising:

(i) a chamber having an interior space maintained at a reduced pressure below atmospheric pressure, the chamber including entrance and exit means at opposite ends thereof;

(ii) at least one linearly extending vapor source means for supplying the interior space of the chamber with at least one linearly extending stream of lubricant vapor;

(iii) a substrate/workpiece mounting/supporting means for mounting/supporting thereon a plurality of substrates/workpieces with the surfaces thereof in facing relation to said at least one linearly extending vapor source means; and (iv) a transporter/conveyor means for continuously moving the substrate/workpiece mounting/supporting means transversely past the at least one stream of lubricant vapor from the at least one linearly extending vapor source means;

(b) introducing a substrate/workpiece mounting/supporting means into the chamber via the entrance means, the substrate/workpiece mounting/supporting means supporting thereon a plurality of substrates/workpieces with similar thermal histories;

(c) continuously moving the substrate/workpiece mounting/supporting means with the plurality of substrates/workpieces mounted/supported thereon transversely past the at least one linearly extending stream of lubricant vapor from the at least one linearly extending vapor source means and depositing a uniform thickness thin film of the lubricant on at least one surface of each of the plurality of substrates/workpieces; and (d) withdrawing the substrate/workpiece mounting/supporting means with the plurality of lubricant thin film-coated substrates/workpieces mounted/supported thereon from the chamber via the exit means.

According to certain embodiments of the present invention, step (a) comprises providing an in-line vapor deposition apparatus comprising at least one spaced-apart, opposed pair of said linearly extending vapor sources for supplying the interior space of the chamber with at least one pair of opposingly directed, linearly extending streams of lubricant vapor for depositing a uniform thickness thin film of the lubricant on opposing surfaces of each of the plurality of substrates/workpieces; and the substrate/workpiece mounting/supporting means (iii) and the transporter/conveyor means (iv) are adapted for continuously moving the plurality of substrates/workpieces transversely past the pair of linearly extending vapor sources.

In accordance with particular embodiments of the present invention, step (a) comprises providing an in-line vapor deposition apparatus comprising at least one spaced-apart, opposed pair of vertically oriented, linearly extending vapor sources for supplying the interior space of the chamber with at least one pair of opposingly directed, linearly extending, vertically oriented streams of lubricant vapor; and the substrate/workpiece mounting/supporting means (iii) and the transporter/conveyor means (iv) are adapted for continuously moving a vertically oriented plurality of substrates/workpieces transversely past the pair of vertically oriented, linearly extending vapor sources.

According to embodiments of the present invention, step (b) comprises introducing into the chamber a substrate/workpiece mounting/supporting means mounting/supporting thereon a plurality of disc-shaped substrates for magnetic or magneto-optical (MO) recording media, each having a pair of opposed major surfaces with a stack of layers constituting the magnetic or MO media formed thereon, each layer stack including an outermost, freshly coated carbon-containing protective overcoat layer, wherein step (b) further comprises introducing the plurality of substrates into the chamber such that the freshly coated carbon-containing protective overcoat layer is not exposed to the atmosphere.

In accordance with embodiments of the present invention, step (a)(ii) comprises providing at least one linearly extending vapor source means for supplying at least one linearly extending stream of a vaporized polymeric fluorine-containing lubricant material; and step (a)(ii) further comprises providing a vapor source means including a plurality of reservoirs of liquid polymeric fluorine-containing lubricant material, wherein the liquid polymeric lubricant material comprises a range of molecular weights and the plurality of reservoirs contain different volumes of liquid lubricant material for regulating the molecular weight distribution of the at least one stream of lubricant vapor for minimizing variation of the thickness of the thin films of lubricant during an interval in which the method is performed.

According to particular embodiments of the present invention, step (a)(ii) comprises providing the at least one vapor source means as fabricated of a high thermal conductivity material and including a plurality of linearly arranged vapor orifices for supplying the at least one linearly extending stream of lubricant vapor.

In accordance with a preferable embodiment of the present invention, step (a)(iii) comprises providing the substrate/workpiece mounting/supporting means in the form of a flat planar pallet including a plurality of spaced-apart openings extending therethrough, each of said openings including means for releasably mounting/supporting therein a flat planar substrate/workpiece.

According to further embodiments of the present invention, the method further comprises the step of:

(e) cleaning the substrate/workpiece mounting/supporting means subsequent to performing step (d) and prior to performing step (b) with another plurality of substrates/workpieces supported thereon.

In accordance with still other embodiments of the present invention, step (a) further comprises providing the in-line vapor deposition apparatus as part of a continuously operable, in-line apparatus adapted for performing at least one antecedent processing step and/or at least one subsequent processing step on the plurality of substrates/workpieces carried by the substrate/workpiece mounting/supporting means.

Another aspect of the present invention is an apparatus for performing simultaneous pass-by vapor deposition of a uniform thickness thin film of a lubricant on at least one surface of each of a plurality of substrates, comprising:

(a) chamber means having an interior space adapted to be maintained at a reduced pressure below atmospheric pressure, the chamber means including entrance and exit means at opposite ends thereof;

(b) at least one linearly extending vapor source means for supplying the interior space of the chamber with at least one linearly extending stream of lubricant vapor;

(c) a substrate/workpiece mounting/supporting means adapted for mounting/supporting thereon a plurality of substrates/workpieces with the surfaces thereof in facing relation to the at least one linearly extending vapor source means, each of the substrates/workpieces having a similar thermal history; and (d) a transporter/conveyor means for continuously moving the substrate/workpiece mounting/supporting means transversely past the at least one linearly extending stream of lubricant vapor from the at least one linearly extending vapor source means for depositing a uniform thickness thin film of lubricant on the surfaces of each of a plurality of substrates/workpieces facing the at least one linearly extending vapor source means.

According to embodiments of the present invention, the at least one linearly extending vapor source means (b) comprises at least one spaced-apart, opposed pair of linearly extending vapor sources for supplying the interior space of the chamber (a) with at least one pair of opposingly directed, linearly extending streams of lubricant vapor for depositing a uniform thickness thin film of the lubricant on opposing surfaces of each of the plurality of substrates/workpieces; and the substrate/workpiece mounting/supporting means (c) and the transporter/conveyor means (d) are adapted for continuously moving the plurality of substrates/workpieces transversely past the linearly extending streams of lubricant vapor from the pair of linearly extending vapor sources.

According to a particular embodiment of the present invention, the at least one spaced-apart, opposed pair of linearly extending vapor sources are oriented vertically for supplying the interior space of the chamber with at least one pair of opposingly directed, linearly extending, vertically oriented streams of lubricant vapor; and the substrate/workpiece mounting/supporting means (c) and the transporter/conveyor means (d) are adapted for continuously moving a vertically oriented plurality of disc-shaped substrates/workpieces transversely past the pair of vertically oriented, linearly extending vapor sources.

In accordance with embodiments of the present invention, the vapor source means (b) comprises a high thermal conductivity material and includes a plurality of linearly arranged vapor orifices for supplying the at least one linearly extending stream of lubricant vapor; and the vapor source means (b) includes a plurality of reservoirs each adapted to contain a quantity of liquid polymeric lubricant material, wherein the liquid polymeric lubricant material comprises a range of molecular weights and the plurality of reservoirs are adapted to contain different volumes of liquid lubricant material for regulating the molecular weight distribution of the stream of lubricant vapor for minimizing variation of the thickness of the thin films of lubricant during an interval of operation of the apparatus.

According to certain embodiments of the present invention, the substrate/workpiece mounting/supporting means comprises a flat planar pallet including a plurality of spaced-apart openings extending therethrough, each of the openings including means for releasably mounting/supporting therein a flat planar substrate/workpiece.

In accordance with further embodiments of the present invention, the chamber means (a) has a cross-sectional area sufficiently large to eliminate difference in lubricant vapor pressure along the length of the at least one linearly extending vapor source means (b), whereby the vapor source means (b) delivers a uniform flow of lubricant vapor along its length; and the chamber means (a) includes means for monitoring the rate of vapor effusion from the at least one linearly extending vapor source (b).

According to still other embodiments of the present invention, the apparatus further comprises:
(e) cleaning means for cleaning the substrate/workpiece mounting/supporting means (c) subsequent to withdrawal from the chamber means (a) via the exit means and prior to re-introduction to the chamber means (a) via the entrance means.

According to another aspect of the present invention, the pass-by vapor deposition apparatus forms part of a continuously operable, in-line apparatus adapted for performing at least one antecedent processing step and/or at least one subsequent processing step on said plurality of substrates/workpieces carries by the substrate/workpiece mounting/supporting means.

Yet another aspect of the present invention is an apparatus for performing simultaneous pass-by vapor deposition of a thin film of a lubricant on at least one surface of each of a plurality of substrates, comprising:
(a) chamber means having an interior space adapted to be maintained at a reduced pressure below atmospheric pressure, the chamber means including entrance and exit means at opposite ends thereof; and
(b) means within the chamber for performing pass-by vapor deposition of a uniform thickness of the thin film of lubricant on at least one surface of each of the plurality of substrates.

Additional advantages and aspects of the present invention will become readily apparent to those skilled in the art from the following detailed description, wherein embodiments of the present invention are shown and described, simply by illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, in which like reference numerals are employed throughout to designate similar features, wherein.

DESCRIPTION OF THE INVENTION

The present invention is based upon recognition by the inventor that the above-described limitations/drawbacks inherent in the conventional cassette based, single disc, static lubricant vapor deposition methodology/apparatus utilized in the automated manufacture of disc-shaped magnetic and MO recording media, e.g., poor lubricant film thickness, reduced product throughput, contamination of neighboring process chambers or modules of an in-line system, variation of average MW of the deposited polymeric lubricant over time, unequal thermal histories of substrates conveyed in cassettes, the requirement for removal from and reinsertion of substrates into the cassettes, etc., can be avoided, or at least minimized, by use of "pass-by" lubricant vapor deposition apparatus and methodology, wherein a plurality of disc-shaped substrates (rather than a single substrate) are continuously moved past at least one linearly elongated lubricant vapor source for lubricant thin film vapor deposition on at least one surface thereof. As a consequence of the inventive apparatus and methodology, thickness uniformity of the deposited lubricant thin films and product throughput rates are significantly improved vis-à-vis the conventional art described above. In addition, the improved, elongated lubricant vapor source(s) provided according to the present invention effectively eliminate(s) problems and difficulties associated with temporal changes in the polymer lubricant fractionation process which occur as the lubricant liquid volume is reduced during system operation via vaporization.

The apparatus and methodology of the present invention provide uniform thickness lubricant thin films by means of vapor deposition, at rates consistent with the requirements of automated manufacturing processing, while retaining the advantages of vapor deposition of the lubricant thin films, including, inter alia, solventless processing, elimination of the requirement for pre-fractionation of the polymeric lubricant materials to obtain a desired molecular weight distribution, and obtainment of very high percentages of bonded lubricant when utilized in modular form in the automated manufacture of magnetic and/or MO recording media with freshly deposited carbon-based protective overcoat layers thereon, e.g., as when the carbon-containing protective overcoat layer is deposited in a system module downstream from (i.e., before) the lubricant vapor deposition module of the present invention and transported to the latter without atmospheric contact, as in an in-line, continuous system.

According to the invention, a modular lubricant thin film vapor deposition apparatus forming part of a continuous, in-line manufacturing system, utilizes a "pass-by" deposition method, as opposed to the conventional "static" method. Thus, according to the invention, the material to be deposited, e.g., a lubricant, is contained in a vapor source comprising a closed, elongated, heated vapor source chamber having a length much greater than the maximum dimension of individual substrates/workpieces, and allowed to vaporize and exit the vapor source chamber via a linear array of orifices forming nozzles which create a linearly elongated stream of lubricant vapor. Typically, the elongated vapor source chamber with the linear array of orifices is vertically oriented and positioned within the interior space of a deposition chamber maintained at a reduced pressure, e.g., from about $10^{-5}$ to about $10^{-9}$ Torr by a suitable vacuum pump means. The deposition chamber is elongated in a direction transverse to the direction of elongation of the vapor source, whereby a plurality of substrates/workpieces, e.g., discs for magnetic or MO recording media, carried and moved in a vertical orientation by a mounting/supporting means (e.g., a perforated pallet) and a transport/conveyor mechanism, are passed in front of and in close proximity to the linearly elongated vapor source/vapor stream. The plurality of substrates/workpieces are "passed by" the linearly arrayed orifices of the elongated vapor source in a continuous motion, i.e., without stopping to provide a static interval when directly opposite the lubricant vapor source, as in conventional processing, thereby eliminating the above-described disadvantages/drawbacks inherently associated with static processing which contribute to lubricant thickness non-uniformity. In addition, the "pass-by" method of the present invention, wherein a substantial plurality of substrates/workpieces is processed, rather than a single substrate/workpiece as in conventional "static" processing, provides a significant increase in product throughput vis-à-vis the conventional method/apparatus, eliminates any requirement for transfer of individual substrates/workpieces from/to cassettes, and utilizes substrates/workpieces with similar thermal histories. Moreover, according to the inventive apparatus/methodology, lubricant thin films are conveniently simultaneously formed on opposing sides of substrates/workpieces, e.g., discs for magnetic and/or MO recording media, by providing the deposition chamber with at least a pair of spaced-apart, linearly elongated vapor sources positioned in parallel, facing relation, and utilizing a substrate/workpiece mounting/supporting means (e.g., a vertically oriented perforated pallet) which is transported in the space between the facing vapor sources and thereby exposes the opposing surfaces of the substrates/workpieces to respective linearly elongated lubricant vapor streams. In addition to the above-enumerated advantages, the inventive apparatus/methodology provides for ready control of the deposition rate of the lubricant, as by appropriate variation of any combination of "pass-by" speed, lubricant vapor pressure, orifice diameter, etc., such that a desired lubricant film thickness is obtained.

According to embodiments of the invention of particular utility when the lubricant liquid comprises a polymeric material having a distribution of molecular weights ("MW"), the above-mentioned problem associated with the conventional lubricant vapor sources, i.e., temporal variation in the MW distribution of the lubricant vapor over an interval of operation arising from the tendency for lower MW lubricant molecules to evaporate first and the inability to replenish liquid lubricant during operation of the vapor source, is substantially eliminated, or at least minimized, by providing the elongated vapor source(s) of the present invention with a plurality of reservoirs for liquid polymeric lubricant material, wherein the plurality of reservoirs are adapted to contain different volumes of liquid lubricant material for regulating the molecular weight distribution of the linearly extending stream of lubricant vapor supplied therefrom.

Figure 1:
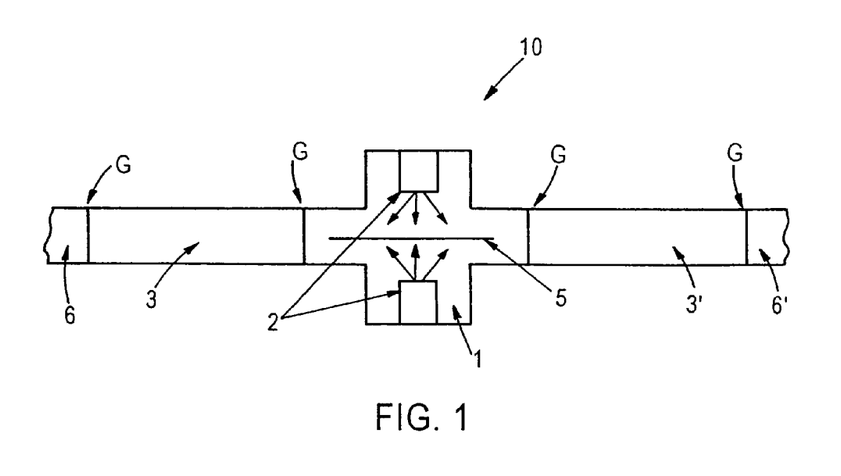
FIG. 1 is a simplified, schematic cross-sectional top view of an embodiment of an in-line, pass-by lubricant vapor deposition apparatus according to the present invention.
Figure 2:
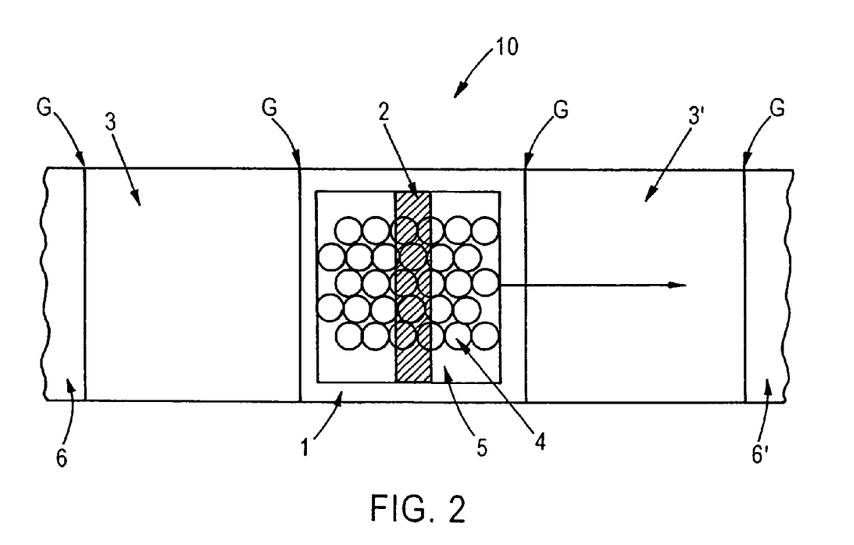
FIG. 2 is a simplified, schematic cross-sectional side view of the in-line, pass-by lubricant vapor deposition apparatus according to the embodiment of the present invention shown in FIG. 1.

Referring now to FIGS. 1-2, shown therein, in simplified, schematic cross-sectional top and side views, respectively, is an embodiment of an in-line, "pass-by" lubricant vapor deposition apparatus 10 according to the invention, which apparatus can form a module of a larger, in-line apparatus for continuous, automated manufacture of, e.g., magnetic and/or magneto-optical (MO) recording media such as hard disks, and wherein a plurality of substrates/workpieces (e.g. disks) are transported in a linear path transversely past at least one linearly elongated lubricant vapor source for deposition of a thin film of lubricant on at least one surface of each of the plurality of substrates.

More specifically, apparatus 10 comprises a series of linearly elongated, vacuum chambers interconnected by gate means G of conventional design, including a centrally positioned deposition chamber 1 including at least one, preferably a pair of spaced-apart, opposingly facing, linearly elongated lubricant vapor sources 2, and a pair of buffer/isolation chambers 3, 3' at opposite lateral ends of central deposition chamber 1 for insertion and withdrawal, respectively, of a plurality of vertically oriented substrates/workpieces, illustratively a plurality disc-shaped substrates 4 carried by substrate/workpiece mounting/support means 5, e.g., a perforated, flat planar pallet including conventional means (not shown in the drawing for illustrative simplicity) for releasably mounting/supporting the disc-shaped substrates 4 such that each of the opposing surfaces thereof faces a respective linearly elongated lubricant vapor source 2 during "pass-by" transport. Chambers 6, 6' respectively connected to the distal ends of inlet and outlet buffer/isolation chambers 3, 3' are provided for use of apparatus 10 as part of a larger continuously operating, in-line apparatus wherein substrates/workpieces 4 receive processing antecedent and/or subsequent to processing in apparatus 10.

Apparatus 10 is provided with conventional vacuum means (not shown in the drawing for illustrative simplicity) for maintaining the interior spaces of each of the constituent chambers 1, 3, 3', etc. at a reduced pressure below atmospheric pressure, e.g., from about $10^{-5}$ to about $10^{-9}$ Torr, and is further provided with a substrate/workpiece conveyor/transporter means of conventional design (not shown in the drawings for illustrative simplicity) for linearly transporting substrate/workpiece mounting/supporting means 5 through the respective gate means G from chamber-to-chamber in its travel through apparatus 10.

As indicated above, according to a preferred embodiment of the present invention of particular utility in the manufacture of disc-shaped magnetic and/or MO recording media, the substrates/workpieces 4 carried by the substrate/workpiece mounting/supporting means 5 are in the form of annular discs, with inner and outer diameters corresponding to those of conventional hard disc-type magnetic and/or MO media, and the central, deposition chamber 1 of apparatus 10 is provided with a pair of opposingly facing, linearly extending vapor deposition sources 2 for deposition of a lubricant thin film on each surface of each of the plurality of discs carried by the perforated pallet mounting/supporting means 5.

Figure 3:
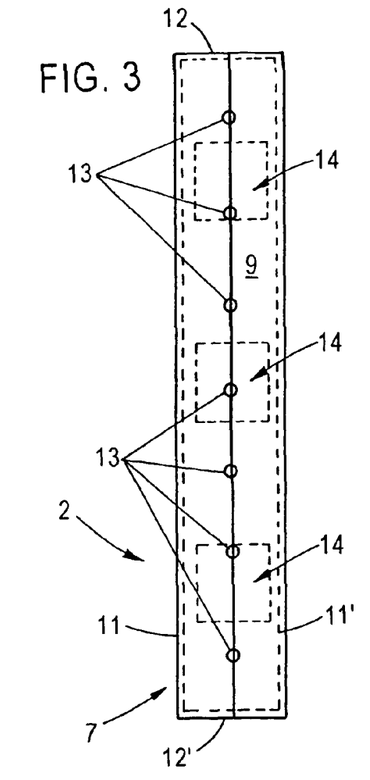
FIG. 3 is a simplified, schematic front view of a linearly extended lubricant vapor source according to an embodiment of the invention.
Figure 4:
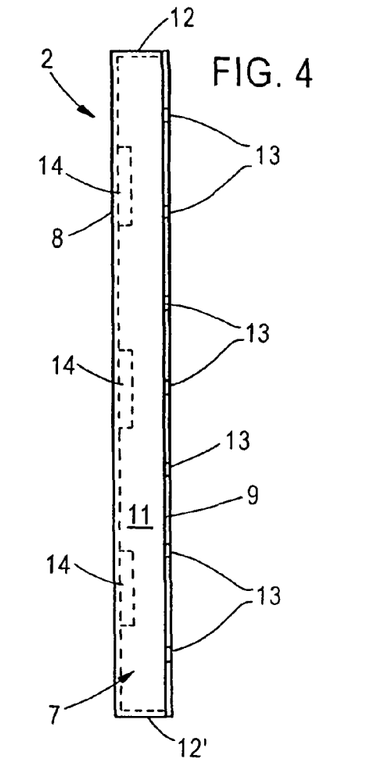
FIG. 4 is a simplified, schematic side view of a linearly extended lubricant vapor source according to the embodiment shown FIG. 3.

Adverting to FIGS. 3 and 4, shown therein are simplified, schematic front and side views, respectively, of a linearly extended lubricant vapor source 2 for use in apparatus 10 according to an embodiment of the invention, which embodiment enjoys particular utility with liquid lubricant materials comprised of polymeric materials having a range of molecular weights. As illustrated, linearly extended lubricant vapor source 2 comprises an elongated rectangular-box shaped enclosure 7 including a back wall 8 and a front wall 9 connected by a pair of longitudinally extending sidewalls 11, 11' and a pair of transversely extending sidewalls 12, 12'. The front wall 9 of the linearly extending enclosure 7 is provided with a linear array of openings 13, illustratively circularly-shaped openings, which openings form orifices for lubricant vapor exiting the chamber formed by enclosure 7. As should be evident from FIGS. 3-4, the linear array of openings or orifices 13 allows formation of a linearly extending vapor stream extending for a significant portion of the length of enclosure 7. Each of the walls comprising vapor source enclosure 7 is fabricated of a high thermal conductivity material, e.g., a metal such as copper.

Mounted at spaced locations along the inner surface of back wall 8 of enclosure 7 are a plurality of liquid lubricant reservoirs 14 each fabricated from a block of thermally conductive material, e.g., a metal such as copper, and mounted on or within the outer surface of the back wall 8 of enclosure 7 are a plurality of electrical resistance heating elements (not shown in the drawings for illustrative simplicity) for heating and vaporizing liquid lubricant contained in each of the reservoirs 14. Thermocouples are also provided in order to control the temperature of the vapor source in order to maintain a constant lubricant vapor flux. In this regard, the linear array of orifices 13 provides for formation of a linearly extending lubricant vapor stream. The vapor effusion rate may be monitored by an ion gauge in line-of-sight communication with the orifices. A quartz crystal monitor or a quadrupole residual gas analyzer may also be employed to similar effect.

Figure 5A:
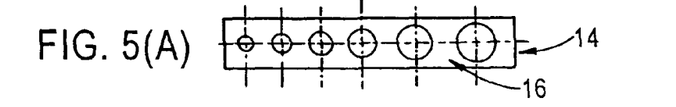
FIGS. 5(A) and 5(B), respectively, are simplified, schematic top and side views, respectively, of an embodiment of the liquid lubricant reservoirs of the linearly extended lubricant vapor source illustrated in FIGS. 3-4.
Figure 5B:
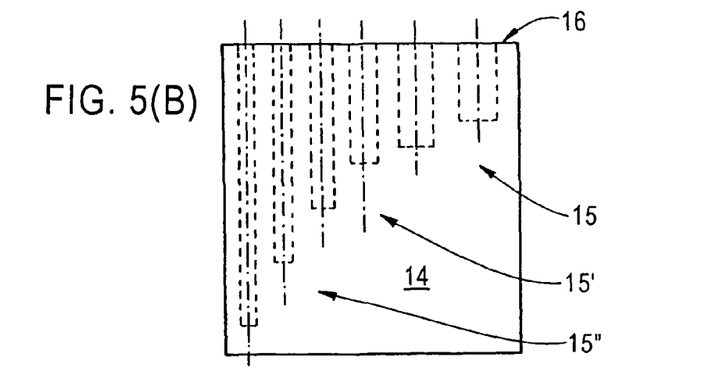

Referring to FIGS. 5(A)-5(B), shown therein are simplified, schematic top and side views, respectively, of an embodiment of the liquid lubricant reservoirs 14 of the linearly extended lubricant vapor source illustrated in FIGS. 3-4, which substantially eliminates, or at least minimizes, the above-described drawbacks/disadvantages associated with the tendency for the MW distribution of the polymeric lubricant vapor to vary over time. According to this embodiment, each of the reservoirs 14 comprises a solid block of thermally conductive material, e.g., a metal such as copper, including a plurality of recesses 15, 15', 15", etc. formed in an upwardly facing narrow edge 16 thereof (i.e., when mounted on back wall 8 of enclosure 7), and each recess comprises a hole of different diameter and/or depth providing a multiplicity of recesses 15, 15', 15", etc. for containing different volumes of liquid lubricant and for providing different thermal conductances and surface areas in contact with liquid lubricant.

According to the invention, when the lubricant vapor source is heated to a temperature sufficient to vaporize the liquid lubricant, the vapor diffuses to and through the orifices to form a linearly extending vapor stream, and lubricant deposits on the substrates (discs) as they traverse the vapor stream(s). Since each differently sized hole formed in the reservoir blocks contains a different amount of liquid lubricant, the smallest hole containing the smallest volume of lubricant will be the first to be depleted of the lower MW fractions of the polymeric lubricant material, and as a consequence, the higher MW fractions will begin to evaporate sooner than in the larger holes containing larger volumes of lubricant. The result is a reduction in the effect of fractionation on the average MW of the polymeric lubricant. An additional advantage provided by the inventive vapor source is a significant increase in the intervals between shut-downs of the system for replenishment of the liquid lubricant.

In operation of the linearly configured, in-line apparatus 10 according to the invention, e.g., in the manufacture of magnetic and/or MO recording media, a plurality of substrates/workpieces 4 vertically carried by a suitable mounting/supporting means 5, e.g., a plurality (typically fifty six 95 mm diameter discs) of annular disc-shaped substrates releasably carried by a vertically oriented perforated pallet, are subjected to processing in a continuous, in-line apparatus to deposit on at least one surface thereof a layer stack constituting the recording medium, the outermost layer of the stack comprising a freshly coated carbon-containing protective overcoat, and the thus-prepared substrates/pallet transferred without atmospheric contact, via connecting chamber 6, to entrance buffer/isolation chamber 3 of apparatus 10, transported to central vapor deposition chamber 1 for pass-by lubricant vapor deposition thereon, as described in some detail above, and then transported to exit buffer/isolation chamber 3' for removal or transfer of lubricant-coated substrates via connecting chamber 6' to a further in-line apparatus for subsequent/additional processing. After completion of all processing and exiting of the pallet from the apparatus, the discs are removed therefrom and the pallet re-used with another plurality of substrates. However, prior to re-use in the in-line processing system, the pallet is transported through an etching chamber where both the lubricant and carbon-containing layers formed thereon during the previous processing are removed in an $O_2/Ar$ plasma.

According to the inventive methodology, the reactive gas background pressure in the connecting chambers between the station or module for carbon-containing protective overcoat layer deposition and the vapor lubrication station or module is at most $1 \times 10^6$ Torr, thus ensuring that the carbon-based films are not degraded by exposure to the atmosphere. Further, each of the disks carried by the perforated pallet arrives in the vapor lubrication station or module with a similar thermal history and therefore the disc-to-disc lubricant thickness uniformity is improved relative to that of the conventional art relying upon a combination of cassette and single disc transport. Disc-to-disc film thickness uniformity across the dimension of the pallet is also improved as a result of the "pass-by"

nature of the transport/deposition process, and the cross-sectional area of the vapor deposition chamber 1 is sufficiently large to ensure the absence of any pressure differential from one orifice to another, whereby a uniform flow of vaporized lubricant is supplied to the passing substrates. Moreover, any variation in top-to-bottom thickness uniformity can be advantageously adjusted by appropriate selection of the orifice diameters.

The present invention thus provides a number of advantages over conventional static vapor deposition apparatus and methodology, and is of particular utility in automated manufacturing processing of thin film magnetic and MO recording media requiring deposition of uniform thickness lubricant topcoat layers for obtaining improved tribological properties. Specifically, the present invention provides for lubricant deposition in a solventless manner not requiring pre-fractionation processing, with excellent film thickness uniformity and high bonded lube ratios. Further, the inventive apparatus and methodology can be readily utilized as part of conventional manufacturing apparatus/technology in view of their full compatibility with all other aspects of automated manufacture of magnetic and MO media. Finally, the inventive apparatus and methodology are broadly applicable to a variety of vapor deposition processes utilized in the manufacture of a number of different products, e.g., mechanical parts, gears, linkages, etc., requiring lubrication.

In the previous description, numerous specific details are set forth, such as specific materials, structures, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. An apparatus comprising:
a chamber having an interior space configured to be maintained at a reduced pressure below atmospheric pressure,
a vapor source for supplying said interior space of said chamber with a linearly extending stream of lubricant vapor, said vapor source has a linearly elongated shape extending along a first direction;
a supporting member for supporting thereon a plurality of substrates with the surfaces thereof in facing relation to said vapor and source; and
a conveyor for continuously moving said supporting member transversely past said linearly extending stream of lubricant vapor for depositing a uniform thickness film of lubricant on the surfaces of each of said plurality of substrates facing said vapor source, the conveyor configured to move along a second direction transverse to the first direction,
wherein said vapor source comprises a thermal conductive material and includes a plurality of vapor orifices for supplying said linearly extending stream of lubricant vapor, the vapor orifices being arranged along the first direction, and a plurality of reservoirs for containing therein a liquid polymeric lubricant material, a top surface of each of said plurality of reservoirs includes a plurality of recesses each having a different diameter and a different depth configured to contain different volumes of the liquid polymeric lubricant material for regulating a molecular weight distribution of said stream for minimizing variation of the thickness of said films.

2. The apparatus according to claim 1, wherein:
said vapor source comprises at least one spaced-apart, opposed pair of vapor sources for supplying said interior space of said chamber with at least one pair of opposingly directed, linearly extending streams of lubricant vapor for depositing a uniform thickness film of said lubricant on opposing surfaces of each of said plurality of substrates; and
said supporting member and said conveyor are for continuously moving said plurality of substrates transversely past said linearly extending streams of lubricant vapor from said pair of vapor sources.

3. The apparatus according to claim 2, wherein:
said at least one spaced-apart, opposed pair of vapor sources are oriented vertically for supplying said interior space of said chamber with at least one pair of opposingly directed, linearly extending, vertically oriented streams of lubricant vapor; and
said supporting member and said conveyor are for continuously moving a vertically oriented plurality of disc-shaped substrates transversely past said pair of vertically oriented vapor sources.

4. The apparatus according to claim 1, wherein:
said supporting member comprises a pallet including a plurality of spaced-apart openings extending therethrough, each of said openings for releasably supporting therein a substrate.

5. The apparatus according to claim 1, wherein:
said chamber has a cross-sectional area that eliminates any difference in lubricant vapor pressure along the length of said vapor source, whereby said vapor source delivers a uniform flow lubricant vapor along its length; and
said chamber configured to monitor the rate of vapor effusion from said vapor source.

6. The apparatus according to claim 1, wherein said vapor source comprises a box shaped enclosure.

7. The apparatus according to claim 1, wherein said plurality of reservoirs are disposed along the first direction in said vapor source.

8. The apparatus according to claim 1, wherein the supporting member is configured to support two or more substrates along the first direction.

9. The apparatus according to claim 1, wherein each of said plurality of reservoirs is a block of thermally conductive material comprising said plurality of recesses.

10. An apparatus comprising:
a chamber having an interior space configured to be maintained at a pressure below atmospheric pressure;
a vapor source for supplying said interior space of said chamber with a linearly extending stream of lubricant vapor, said vapor source has an elongated shape extending along a first direction, said vapor source comprises a thermal conductive material and comprises an array of openings for forming said linearly extending stream, said vapor source comprises a reservoir for containing therein a liquid lubricant;
a member for supporting thereon a plurality of workpieces with surfaces facing said vapor source; and
a transport for continuously moving said member transversely past said linearly extending stream for depositing a uniform thickness film of lubricant on the surfaces of each of said plurality of workpieces facing said vapor source,
wherein a top surface of said reservoir comprises a plurality of recesses each having a different diameter and a different depth configured to contain different volumes of the liquid lubricant for regulating a molecular weight distribution of said stream for minimizing variation of the thickness of said film.

11. The apparatus of claim 10, wherein said vapor source comprises a box shaped enclosure.

12. The apparatus of claim 10, wherein said vapor source comprises a rectangular-box shaped enclosure.

13. The apparatus of claim 10, wherein a recess of said plurality of recesses has a cylinder shape.

14. An apparatus comprising:
a vapor source for supplying an interior space of a chamber with a linearly extending stream of lubricant vapor, said vapor source has a linearly elongated shape extending along a first direction, said vapor source comprises a metal and comprises an array of orifices for forming said linearly extending stream, said vapor source comprises a reservoir for containing a liquid lubricant;
a member for mounting thereon a plurality of disc-shape substrates with surfaces facing said vapor source; and
a conveyor for continuously moving said member past said linearly extending stream for depositing a uniform thickness film of lubricant on the surfaces of each of said plurality of disc-shape substrates facing said vapor source,
wherein a top surface of said reservoir comprises a plurality of recesses each having a different diameter and a different depth configured to contain different volumes of the liquid lubricant for regulating a molecular weight distribution of said stream for minimizing variation of the thickness of said film.

15. The apparatus of claim 14, wherein said vapor source comprises a box shaped enclosure.

16. The apparatus of claim 14, wherein a recess of said plurality of recesses has a cylinder shape.

17. The apparatus of claim 14, wherein said vapor source comprises a rectangular-box shaped enclosure.

18. The apparatus of claim 14, wherein said member comprises a pallet including a plurality of spaced-apart openings extending therethrough, each of said openings for releasably mounting therein a disc-shape substrate.

19. The apparatus of claim 14, wherein said vapor source comprises at least one spaced-apart, opposed pair of vapor sources having a linearly elongated shape extending along said first direction for depositing a uniform thickness film of said lubricant on opposing surfaces of each of said plurality of disc-shape substrates.

* * * * *